US012684868B2

(12) United States Patent
Kim et al.

(10) Patent No.: US 12,684,868 B2
(45) Date of Patent: Jul. 14, 2026

(54) DISPLAY DEVICE AND METHOD OF MANUFACTURING THE SAME

(71) Applicant: Samsung Display Co., LTD., Yongin-si (KR)

(72) Inventors: Kyumin Kim, Yongin-si (KR);
Shinhyuk Yang, Yongin-si (KR);
Sung-Hoon Lim, Yongin-si (KR);
Seungsok Son, Yongin-si (KR);
Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 339 days.

(21) Appl. No.: 18/447,875

(22) Filed: Aug. 10, 2023

(65) Prior Publication Data

US 2024/0105738 A1     Mar. 28, 2024

(30) Foreign Application Priority Data

Sep. 22, 2022     (KR) ........................ 10-2022-0120009

(51) Int. Cl.
*H01L 27/12*          (2006.01)
*H10D 86/01*          (2025.01)
(Continued)

(52) U.S. Cl.
CPC ........... *H10D 86/60* (2025.01); *H10D 86/021* (2025.01); *H10D 86/441* (2025.01);
(Continued)

(58) Field of Classification Search
CPC ...... H10D 86/60; H10D 86/021; H10D 86/01; H10D 86/441; H10D 86/40; H10D 86/481;
(Continued)

(56) References Cited

U.S. PATENT DOCUMENTS 11,114,474 B2      9/2021   Qu
11,189,737 B2 *  11/2021   Ueoka ...................... H10D 8/60
(Continued)

FOREIGN PATENT DOCUMENTS

KR      10-1993-0018712 A      9/1993
KR           10-0176179 B1      3/1999
(Continued)

OTHER PUBLICATIONS

Korean Office Action corresponding to KR Application No. 10-2022-0120009, dated Mar. 10, 2026 (21 pages).

*Primary Examiner* — Nikolay K Yushin

(74) *Attorney, Agent, or Firm* — Womble Bond Dickinson (US) LLP

(57)          ABSTRACT

A display device includes: a substrate; a spacer on the substrate and including: an upper surface; a first side surface extending toward the substrate from a first end of the upper surface; and a second side surface extending toward the substrate from a second end of the upper surface; an active pattern on the first side surface of the spacer, including a metal oxide semiconductor, and having a source region and a drain region; a source electrode on the second side surface of the spacer and the active pattern, and connected to the source region; a drain electrode on the substrate, including a same material as the source electrode, and connected to the drain region; and a first gate electrode on the active pattern and partially overlapping the first side surface of the spacer.

20 Claims, 19 Drawing Sheets

(51) Int. Cl.
     *H10D 86/40*           (2025.01)
     *H10D 86/60*           (2025.01)
     *H10W 90/00*           (2026.01)
(52) U.S. Cl.
     CPC ......... *H10D 86/451* (2025.01); *H10D 86/481*
                       (2025.01); *H10W 90/00* (2026.01)
(58) Field of Classification Search
     CPC .. H10D 86/423; H10D 30/6755; H10D 30/67;
                 H10D 30/6715; H10D 30/475; H10D
                 86/451; H01L 25/167; H01L 25/16; H01L
                 25/18; H01L 25/105; H10K 59/1216;
                 H10K 59/121; H10K 59/1213; H10K
                 59/131; H10K 50/822; H10K 50/8428;
                 H10K 50/842; H10K 71/00; H10K 71/70;
                 H10K 71/111; H10K 71/421; H10K
                 59/124; H10W 90/00; H10W 90/401;
                                                 H10W 90/701
     See application file for complete search history.

(56)                    References Cited

U.S. PATENT DOCUMENTS

| | | | |
|---|---|---|---|
| 11,495,623 B2 * | 11/2022 | Niu | .................... H10D 86/0221 |
| 2011/0037074 A1 | 2/2011 | Ahn et al. | |
| 2018/0102382 A1 | 4/2018 | Peng et al. | |
| 2020/0266304 A1 * | 8/2020 | Ueoka | .................... H10D 64/64 |
| 2021/0225877 A1 | 7/2021 | Niu et al. | |

FOREIGN PATENT DOCUMENTS

| | | |
|---|---|---|
| KR | 10-0273340 B1 | 1/2001 |
| KR | 10-0658068 B1 | 12/2006 |
| KR | 10-2011-0017247 A | 2/2011 |
| KR | 10-2015-0066867 A | 6/2015 |
| KR | 10-2045288 B1 | 11/2019 |
| WO | WO 2016/200626 A1 | 12/2016 |

* cited by examiner

F I G . 4

BUF
SUB
ACT
SS1
SP
US
SS2

CL2
CL1
BUF
SUB

ACT'
SS1
SP
US
SS2

D2
D1

F I G. 7
PR2
CL2
CL1
BUF
SUB
ACT'
SS1
SP
US
SS2
PR1
D2
D1

F I G . 8
PL2
DE
BUF
SUB
ACT'
SS1
SP
US
SS2
PL1
SE
D2
D1

GE'
IL
PL2
DE
BUF
SUB

ACT'
SS1
SP
US
SS2
PL1
SE

D2
D1

F I G. 10
PR4
GE'
IL
PL2
DE
BUF
SUB
ACT'
SS1
SP
US
SS2
PL1
SE
PR3
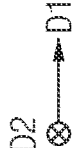
D2
D1

F I G . 11
TFT { ACT GE1 SE DE PL1 PL2
GE1
IL
PL2
DE
BUF
SUB
ACT'    SS1    SP    SS2 US    PL1    GE2 SE    CST
D2 ⊗ → D1

F I G. 12
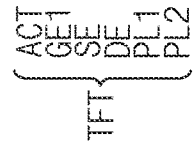
ACT
GE1
SE
DE } TFT
PL1
PL2
GE1
IP1
SS1
PL2
DE
BUF
SUB
A1 A3
ACT
A2
SP
SS2 US
PL1
SE
CST
GE2
IP2
D1
D2 ⊗

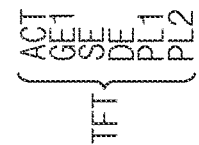
F I G. 14
ACT
GE1
SE
DE
PL1
PL2
TFT
IL2
IL1
GE1
IP1
SS1
PL2
DE
BUF
SUB
CNT
A1 A3
ACT
A2
SP
SS2 US SP
PL1
SE
GE2 CST
IP2
D2
D1

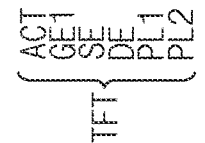
F I G. 15

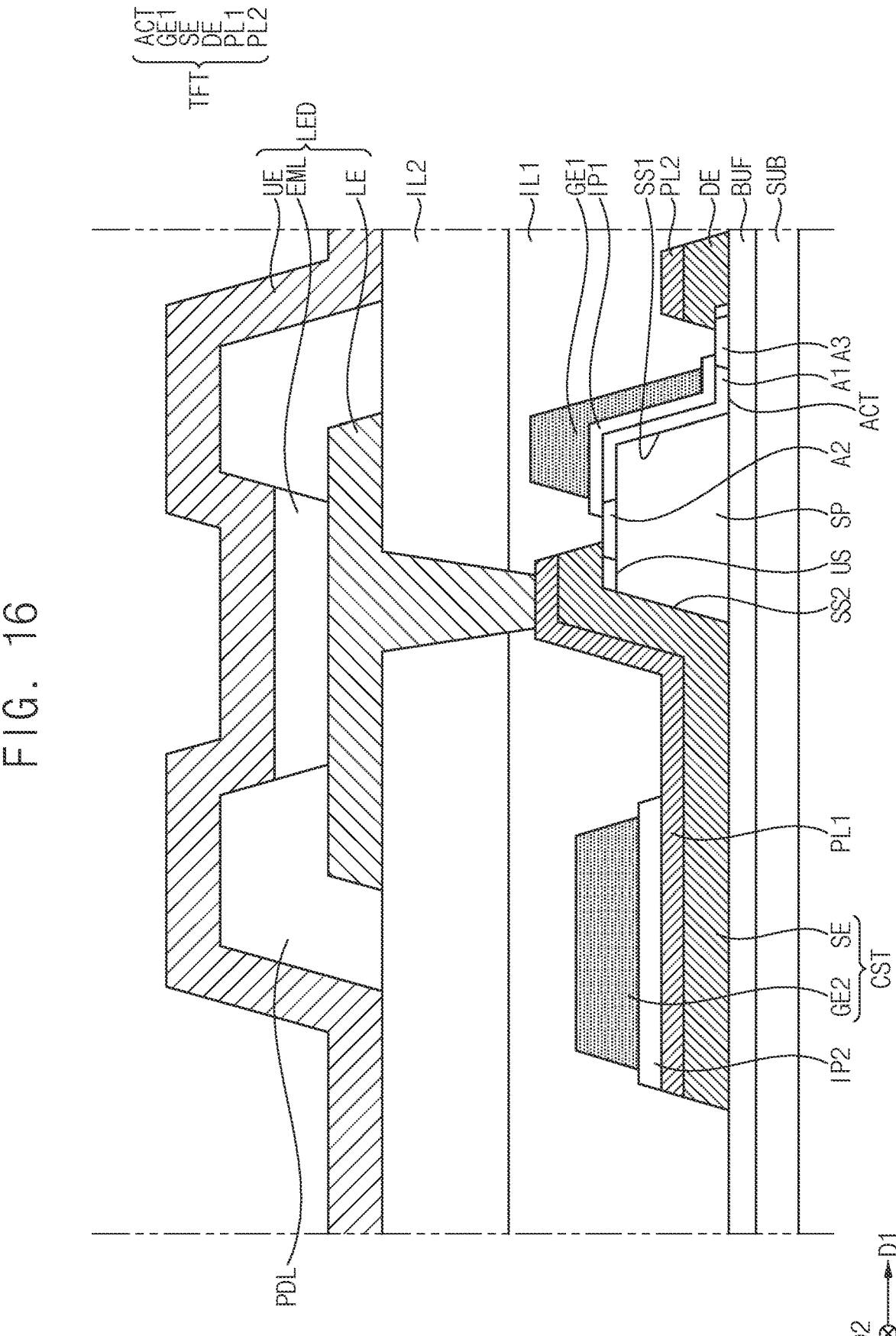
F I G . 16

900

900

DISPLAY DEVICE AND METHOD OF MANUFACTURING THE SAME

CROSS-REFERENCE TO RELATED APPLICATION

The present application claims priority to and the benefit of Korean Patent Application No. 10-2022-0120009, filed on Sep. 22, 2022, in the Korean Intellectual Property Office, the entire content of which is incorporated herein by reference.

BACKGROUND

1. Field

Aspects of some embodiments relate generally to a display device.

2. Description of Related Art

With the development of information technology, the importance of display devices, which provide a connection medium between users and information, has been highlighted. For example, the use of display devices such as liquid crystal display device, organic light emitting display device, plasma display device, or the like is increasing.

Meanwhile, as the resolution of display devices increases, the number of pixels arranged in a display area having the same area increases relatively. In order to drive each pixel, at least one thin film transistor is included for each pixel. The ratio of an area occupied by the thin film transistor in the pixel relatively increases as the resolution increases, which is the main cause of lowering an aperture ratio of the high resolution display device. Accordingly, various technical attempts have been made to increase the aperture ratio of the display device by reducing the area occupied by the thin film transistor.

The above information disclosed in this Background section is only for enhancement of understanding of the background and therefore the information discussed in this Background section does not necessarily constitute prior art.

SUMMARY

Aspects of some embodiments relate generally to a display device. For example, aspects of some embodiments relate to a display device and a method of manufacturing the same.

Aspects of some embodiments include a display device that may be capable of realizing relatively high resolution.

Aspects of some embodiments include a method of manufacturing the display device.

A display device according to some embodiments of the present disclosure may include a spacer on a substrate including an upper surface, a first side surface extending toward the substrate from a first end of the upper surface, and a second side surface extending toward the substrate from a second end of the upper surface, an active pattern on the first side surface of the spacer, including a metal oxide semiconductor, and having a source region and a drain region, a source electrode on the second side surface of the spacer and the active pattern, and connected to the source region, a drain electrode on the substrate, including a same material as the source electrode, and connected to the drain region, and a first gate electrode on the active pattern and partially overlapping the first side surface of the spacer.

According to some embodiments, the metal oxide semiconductor of the active pattern may include a material having chemical resistance.

According to some embodiments, a first end of the active pattern may overlap the upper surface of the spacer and a second end of the active pattern does not overlap the upper surface of the spacer.

According to some embodiments, the source region may overlap the upper surface of the spacer and the drain region does not overlap the upper surface of the spacer.

According to some embodiments, the source electrode may extend along the second side surface of the spacer to an upper surface of the substrate.

According to some embodiments, the source electrode may partially overlap the source region and the drain electrode may partially overlap the drain region.

According to some embodiments, the active pattern may further include a channel region positioned between the source region and the drain region, and partially overlapping each of the upper surface and the first side surface of the spacer. According to some embodiments, the first gate electrode may completely overlap the channel region.

According to some embodiments, a first end of the first gate electrode may overlap the upper surface of the spacer and a second end of the first gate electrode does not overlap the upper surface of the spacer.

According to some embodiments, the display device may further include a first insulating pattern between the active pattern and the first gate electrode. The first insulating pattern may partially overlap each of the source region and the drain region.

According to some embodiments, the display device may further include a second gate electrode on the source electrode and including a same material as the first gate electrode. According to some embodiments, the second gate electrode may constitute a storage capacitor together with a portion of the source electrode overlapping the second gate electrode.

According to some embodiments, the display device may further include a second insulating pattern between the source electrode and the second gate electrode.

According to some embodiments, the spacer may include an insulating material.

According to some embodiments, the display device may further include a first pad layer on the source electrode and a second pad layer on the drain electrode and including a same material as the first pad layer.

According to some embodiments, the display device may further include a lower electrode on the source electrode, a light emitting layer on the lower electrode, and an upper electrode on the light emitting layer. According to some embodiments, the lower electrode may be directly connected to the first pad layer through a contact hole.

According to some embodiments, each of the first side and second side of the spacer may be inclined with respect to the substrate.

A method of manufacturing a display device according to some embodiments of the present disclosure may include forming a spacer on a substrate including an upper surface, a first side surface extending toward the substrate from a first end of the upper surface, and a second side surface extending toward the substrate from a second end of the upper surface on the substrate, forming a preliminary active pattern including a metal oxide semiconductor on the first side surface of the spacer, simultaneously forming a source electrode connected to a first end of the preliminary active pattern on the second side surface of the spacer and the preliminary active pattern, and a drain electrode connected to a second end of the preliminary active pattern on the substrate, and forming a first gate electrode partially overlapping the first side surface of the spacer on the preliminary active pattern.

According to some embodiments, the display device may further include forming an insulating pattern between the preliminary active pattern and the first gate electrode after the forming the first gate electrode.

According to some embodiments, the forming the insulating pattern may include forming an active pattern having a source region, a drain region, and a channel region positioned between the source region and the drain region by introducing hydrogen into the preliminary active pattern.

According to some embodiments, the source electrode may be connected to the source region to partially overlap the source region and the drain electrode may be connected to the drain region to partially overlap the drain region.

According to some embodiments, the metal oxide semiconductor of the preliminary active pattern may be formed using a material having chemical resistance.

In a display device according to some embodiments of the present disclosure, an active pattern of a transistor on a substrate may extend along a side surface of a spacer due to the spacer located on the substrate. Here, the active pattern may include a metal oxide semiconductor. That is, the transistor may have a vertical transistor structure. Accordingly, because the length of a channel region of the active pattern is determined vertically, a sufficient length of the channel region may be secured. Through this, the high resolution of the display device may be implemented.

In addition, in a method of manufacturing the display device according to some embodiments of the present disclosure, the spacer may be formed on the substrate, the active pattern may be formed to extend along upper and side surfaces of the spacer, and a source electrode connected to one end of the active pattern. and a drain electrode connected to the other end of the active pattern may be simultaneously formed. That is, because the source electrode and the drain electrode constituting the vertical transistor are formed through the same process, the number of masks in the entire process may be reduced. Accordingly, the process cost of the display device may be relatively reduced.

BRIEF DESCRIPTION OF THE DRAWINGS

Illustrative, non-limiting embodiments will be more clearly understood from the following detailed description in conjunction with the accompanying drawings.

FIGS. 4, 5, 6, 7, 8, 9, 10, 11, 12, 13, 14, 15, and 16 are cross-sectional views for explaining a method of manufacturing the display device of FIG. 3 according to some embodiments of the present disclosure.

DETAILED DESCRIPTION

Figure 1:
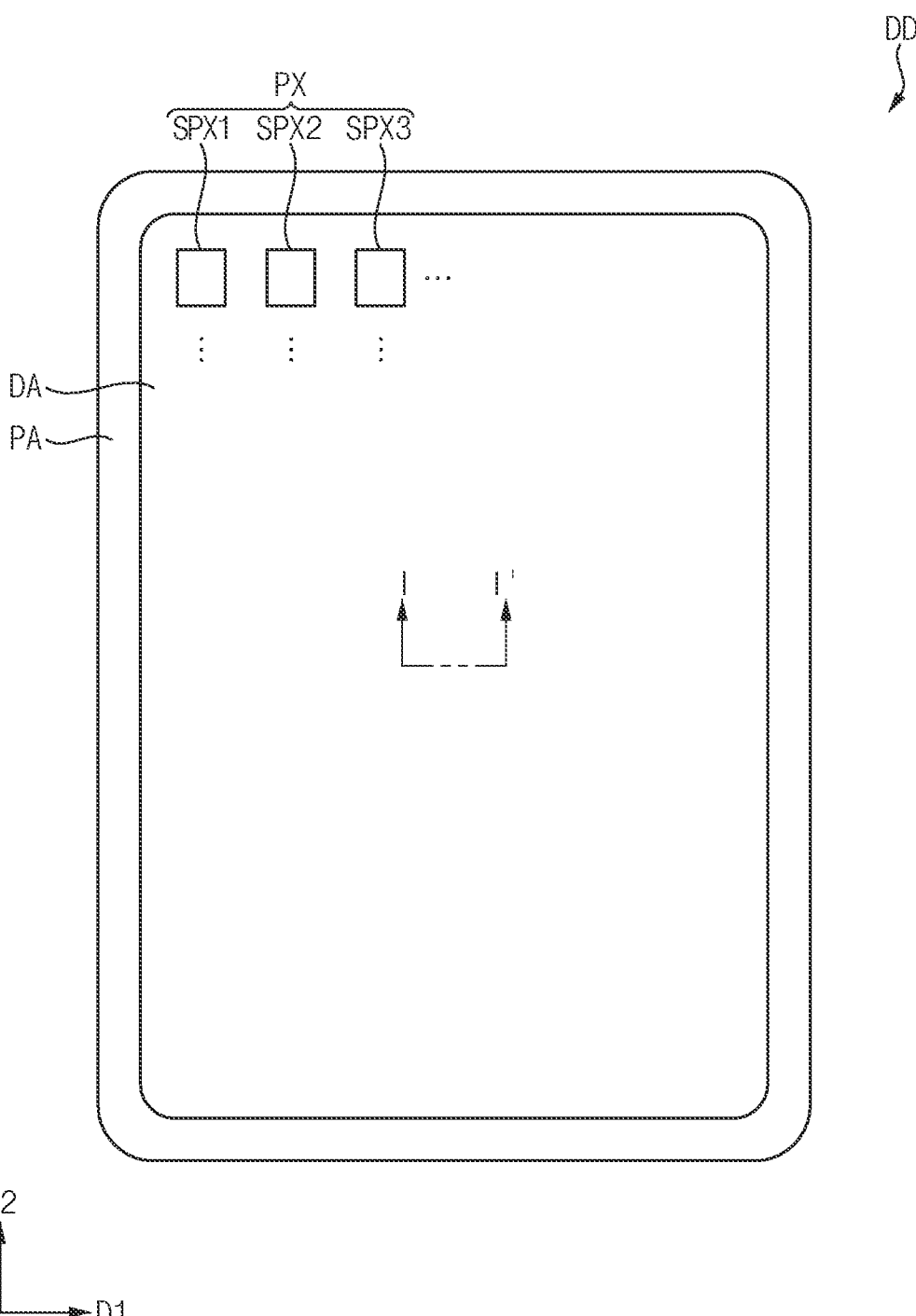
FIG. 1 is a plan view illustrating a display device according to some embodiments of the present disclosure.

Hereinafter, a display device and method of manufacturing the same according to some embodiments of the present disclosure will be explained in more detail with reference to the accompanying drawings. The same reference numerals are used for the same components in the drawings, and redundant descriptions of the same components will be omitted.

FIG. 1 is a plan view illustrating a display device according to some embodiments of the present disclosure.

Referring to FIG. 1, a display device DD according to some embodiments of the present disclosure may be divided into a display area DA and a non-display area NDA. The display area DA may be an area capable of displaying images by generating light or adjusting transmittance of light provided from an external light source. The non-display area NDA may be an area not displaying images. The non-display area NDA may be positioned around the display area DA. For example, the non-display area NDA may surround the display area DA.

In a plan view, the display device DD may have a rectangular shape with rounded corners. However, embodiments according to the present disclosure are not limited thereto, and the display device DD may have various shapes in the plan view.

The display device DD may include a plurality of pixels PX located in the display area DA. By emitting light from the plurality of pixels PX, the display area DA may display an image.

Each of the plurality of pixels PX may include a first sub-pixel SPX1, a second sub-pixel SPX2, and a third sub-pixel SPX3. According to some embodiments, the first sub-pixel SPX1 may be a red sub-pixel that emits red light, the second sub-pixel SPX2 may be a green sub-pixel that emits green light, and the third sub-pixel SPX3 may be a blue sub-pixel that emits blue light. However, the color of light emitted from the first, second, and third sub-pixels SPX1, SPX2, and SPX3 is not limited thereto. In addition, although the number of first, second, and third sub-pixels SPX1, SPX2 and SPX3 is illustrated as three, it is not limited thereto. For example, each of the plurality of pixels PX may further include a fourth sub-pixel that emits white light.

The plurality of pixels PX may be arranged in a matrix form along a first direction D1 and a second direction D2 crossing the first direction D1. Accordingly, each of the first sub-pixel SPX1, the second sub-pixel SPX2, and the third sub-pixel SPX3 may be arranged in a matrix form along the first and second directions D1 and D2.

The display device DD may include drivers located in the non-display area NDA. For example, the drivers may include a gate driver, a data driver, and the like. The drivers may be electrically connected to the pixels PX. The drivers may provide signals and voltages for emitting the light to the plurality of pixels PX.

A plane may be defined as the first direction D1 and the second direction D2 crossing the first direction D1. For example, the first direction D1 may be perpendicular to the second direction D2.

Figure 2:
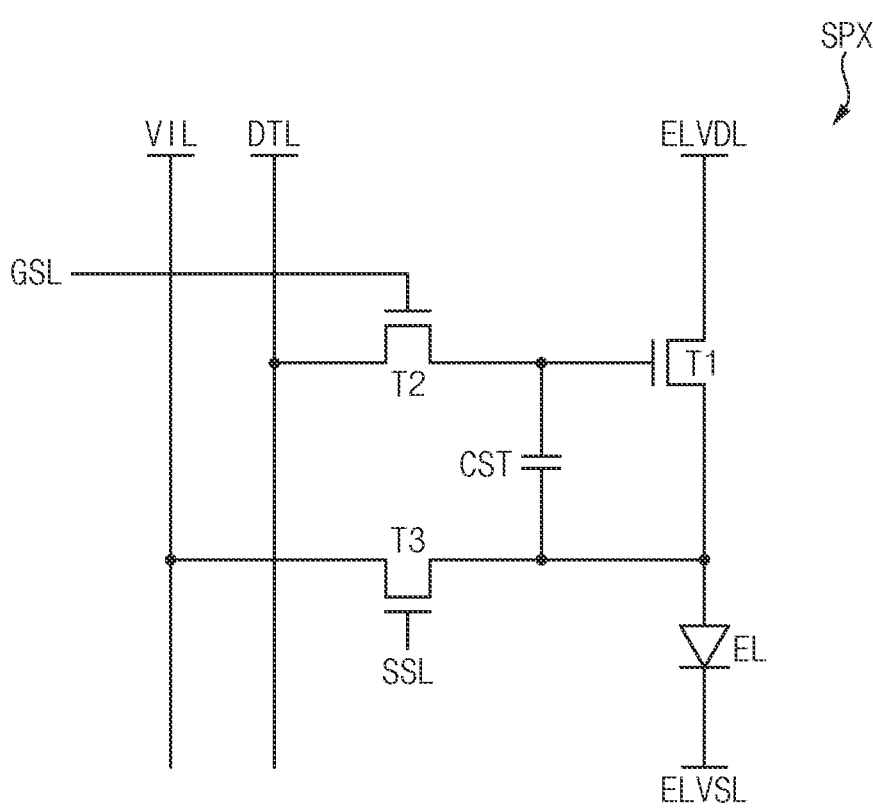
FIG. 2 is a circuit view illustrating one sub-pixel of the display device of FIG. 1 according to some embodiments of the present disclosure.

FIG. 2 is a circuit view illustrating one sub-pixel of the display device of FIG. 1. For example, the circuit view of a sub-pixel SPX illustrated in FIG. 2 illustrates a circuit view of any one of the first, second, and third sub-pixels SPX1, SPX2, and SPX3 illustrated in FIG. 1.

Referring to FIG. 2, the sub-pixel SPX may include first, second, and third transistors T1, T2, and T3, a storage capacitor CST, and a light emitting element EL.

The first transistor T1 may adjust a current flowing from a driving voltage line ELVDL to which a driving voltage is supplied to the light emitting element EL according to a voltage difference between a gate electrode and a source electrode. For example, the first transistor T1 may be a driving transistor for driving the light emitting element EL. The gate electrode of the first transistor T1 may be connected to a source electrode of the second transistor T2, the source electrode of the first transistor T1 may be connected to a first electrode of the light emitting element EL, and a drain electrode of the first transistor T1 may be connected to the driving voltage line ELVDL to which the driving voltage is applied.

The second transistor T2 may be turned on by a gate signal of a gate signal line GSL to connect a data line DTL to the gate electrode of the first transistor T1. A gate electrode of the second transistor T2 may be connected to the gate signal line GSL, a source electrode of the second transistor T2 may be connected to the gate electrode of the first transistor T1, and a drain electrode of the second transistor T2 may be connected to the data line DTL.

The third transistor T3 may be turned on by a sensing signal of a sensing signal line SSL to connect an initialization voltage line VIL to one end of the light emitting element EL. A gate electrode of the third transistor T3 may be connected to the sensing signal line SSL, a drain electrode of the third transistor T3 may be connected to the initialization voltage line VIL, and a source electrode of the third transistor T3 may be connected to one end of the light emitting element EL or to the source electrode of the first transistor T1.

However, the source electrode and the drain electrode of each of the first, second, and third transistors T1, T2, and T3 are not limited thereto, and vice versa. In addition, each of the first, second, and third transistors T1, T2, and T3 may be formed as a thin film transistor.

The storage capacitor CST may be formed between the gate electrode and the source electrode of the first transistor T1. The storage capacitor CST may store a difference voltage between the gate voltage and the source voltage of the first transistor T1.

The light emitting element EL may emit light according to the current supplied through the first transistor T1. The light emitting element EL may be an organic light emitting diode including a first electrode (e.g., an anode electrode), an organic light emitting layer, and a second electrode (e.g., a cathode electrode). However, it is not limited thereto. The first electrode of the light emitting element EL may be connected to the source electrode of the first transistor T1, and the second electrode of the light emitting element EL may be connected to the common voltage line ELVSL to which a common voltage lower than the driving voltage is applied.

However, in FIG. 2, the case where the sub-pixel SPX includes three transistors and one storage capacitor has been described, but the present disclosure is not limited thereto. According to some embodiments, the sub-pixel SPX may include fewer components or additional components without departing from the spirit and scope of embodiments according to the present disclosure.

Figure 3:
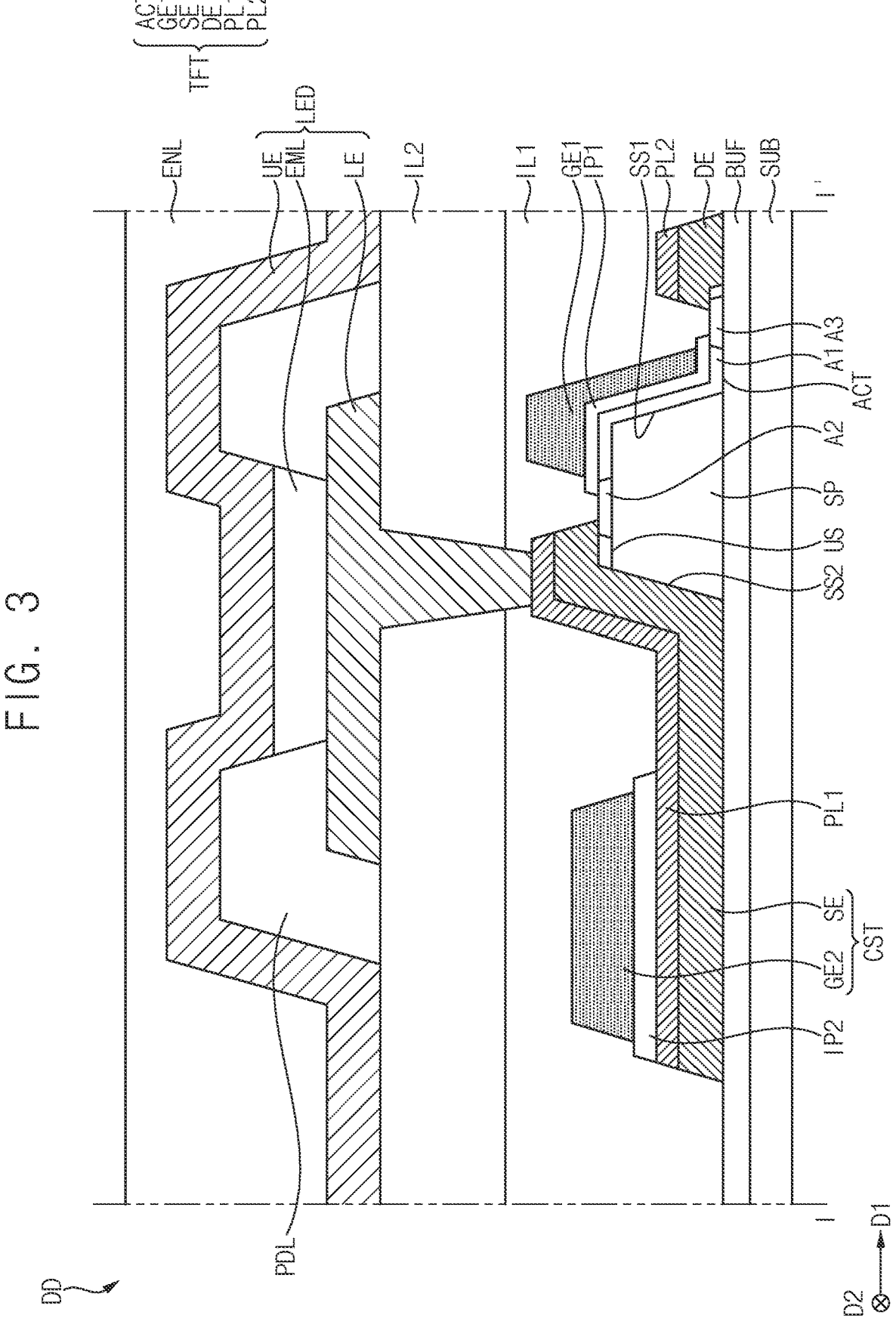
FIG. 3 is a cross-sectional view taken along the line I-I' of FIG. 1 according to some embodiments of the present disclosure.

FIG. 3 is a cross-sectional view taken along the line I-I' of FIG. 1.

Referring to FIG. 3, the display device DD according to some embodiments may include a substrate SUB, a buffer layer BUF, a spacer SP, a transistor TFT, a first insulating pattern IP1, a second insulating pattern IP2, a second gate electrode GE2, a first insulating layer IL1, a second insulating layer IL2, a pixel defining layer PDL, a light emitting element LED, and an encapsulation layer ENL.

Here, the transistor TFT may include an active pattern ACT, a first gate electrode GE1, a source electrode SE, a first pad layer PL1, a drain electrode DE, and a second pad layer PL2. In addition, the light emitting element LED may include a lower electrode LE, a light emitting layer EML, and an upper electrode UE.

The substrate SUB may include a transparent material or an opaque material. The substrate SUB may be consisting of a transparent resin substrate. Examples of the transparent resin substrate include polyimide substrates and the like. In this case, the polyimide substrate may include a first organic layer, a first barrier layer, and a second organic layer. Alternatively, the substrate SUB may include a quartz substrate, a synthetic quartz substrate, a calcium fluoride substrate, an F-doped quartz substrate, a soda-lime glass substrate, a non-alkali glass substrate, and the like. These may be used alone or in combination with each other.

The buffer layer BUF may be located on the substrate SUB. The buffer layer BUF may prevent or reduce diffusion of metal atoms or impurities from the substrate SUB into the transistor TFT. In addition, the buffer layer BUF may improve flatness of the surface of the substrate SUB when the surface of the substrate SUB is not uniform. For example, the buffer layer BUF may include an inorganic insulating material such as silicon oxide ($SiO_x$), silicon nitride ($SiN_x$), silicon oxynitride ($SiO_xN_y$), and the like. These may be used alone or in combination with each other. Alternatively, the buffer layer BUF may be omitted.

The spacer SP may be located on the buffer layer BUF. The spacer SP may include an upper surface US facing the substrate SUB, a first side surface SS1 extending from a first end of the upper surface US toward the substrate SUB, and a second side surface SS2 extending toward the substrate SUB from a second end different from the first end of the upper surface US.

According to some embodiments, each of the first and second side surfaces SS1 and SS2 of the spacer SP may be inclined with respect to the substrate SUB. That is, each of the first and second side surfaces SS1 and SS2 of the spacer SP may have a tapered shape in cross section. In this case, an angle between the first and second side surfaces SS1 and SS2 of the spacer SP and an upper surface of the substrate SUB may be an obtuse angle.

According to some embodiments, each of the first and second side surfaces SS1 and SS2 of the spacer SP may be perpendicular to the substrate SUB. That is, the spacer SP may have a rectangular shape in cross section. In this case, an angle between the first and second side surfaces SS1 and SS2 of the spacer SP and the upper surface of the substrate SUB may be perpendicular.

The spacer SP may include an inorganic insulating material or an organic insulating material. For example, the spacer SP may include an inorganic insulating material such as silicon oxide ($SiO_x$), silicon nitride ($SiN_x$), silicon oxynitride ($SiO_xN_y$), and the like. These may be used alone or in combination with each other.

There may be a plurality of spacers SP, and each spacer SP may be arranged for each sub-pixel (e.g., the first sub-pixel SPX1, the second sub-pixel SPX2, or the third sub-pixel SPX3 of FIG. 1). For example, the spacer SP may be located adjacent to the transistor TFT in the one sub-pixel.

The active pattern ACT may be located on the spacer SP. The active pattern ACT may be arranged to partially overlap the spacer SP. For example, the active pattern ACT may be located on the spacer SP and extend along the first side surface SS1 of the spacer SP to an upper surface of the buffer layer BUF (or the upper surface of the substrate SUB). That is, the active pattern ACT may be located on the upper surface of the buffer layer BUF (or the upper surface of the substrate SUB), the upper surface US of the spacer SP, and the first side surface SS1 of the spacer SP. In other words, a first end of the active pattern ACT may overlap the upper surface US of the spacer SP, and a second end of the active pattern ACT may not overlap the upper surface US of the spacer SP.

The active pattern ACT may have a second region A2, a third region A3, and a first region A1 positioned between the second region A2 and the third region A3. According to some embodiments, the second region A2 may overlap the spacer SP, and the third area A3 may not overlap the spacer SP. In this case, the first region A1 may partially overlap each of the upper surface US and the first side surface SS1 of the spacer SP. Impurities may be doped in each of the second region A2 and the third region A3. For example, each of the second region A2 and the third region A3 may be doped with an n-type impurity.

The second region A2 may be defined as a source region, the third region A3 may be defined as a drain region, and the first region A1 may be defined as a channel region.

The active pattern ACT may include an inorganic semiconductor, an organic semiconductor, or a metal oxide semiconductor. According to some embodiments, the active pattern ACT may include a metal oxide semiconductor. For example, the metal oxide semiconductor may include a binary compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

According to some embodiments, the active pattern ACT may include a metal oxide semiconductor having chemical resistance. For example, the active pattern ACT may include a metal oxide semiconductor having chemical resistance to an etchant used when forming the source electrode SE and the drain electrode DE. In order for the metal oxide semiconductor to have chemical resistance, in the process of forming the source electrode SE and the drain electrode DE, an etchant having a higher etching selectivity for the source electrode SE and the drain electrode DE than an etching selectivity for the active pattern ACT may be used. Alternatively, by crystallizing the active pattern ACT including the metal oxide semiconductor, the metal oxide semiconductor may have chemical resistance.

The source electrode SE may be located on the buffer layer BUF, the spacer SP, and the active pattern ACT. For example, the source electrode SE may be located on the active pattern ACT and extend along the second side surface SS2 of the spacer SP to the upper surface of the buffer layer BUF (or the upper surface of the substrate SUB). That is, the source electrode SE may be located on the upper surface of the buffer layer BUF (or the upper surface of the substrate SUB), the second side surface SS2 of the spacer SP, and the upper surface US of the spacer SP. In other words, a first end of the source electrode SE may overlap the upper surface US of the spacer SP, and a second end of the source electrode SE may not overlap the upper surface US of the spacer SP.

The source electrode SE may be connected to the second region A2 of the active pattern ACT. For example, the source electrode SE may be directly connected to the second region A2 of the active pattern ACT. According to some embodiments, the source electrode SE may partially overlap the second region A2 of the active pattern ACT.

The source electrode SE may include a metal, an alloy, a metal nitride, a conductive metal oxide, a transparent conductive material, and the like. These may be used alone or in combination with each other. For example, the source electrode SE may include a metal such as gold ("Au"), silver ("Ag"), aluminum ("Al"), tungsten ("W"), copper ("Cu"), platinum ("Pt"), nickel ("Ni"), titanium ("Ti"), and the like. According to some embodiments, the source electrode SE may have a multilayer structure including Ti/Al/Ti. However, embodiments according to the present disclosure are not limited thereto, and the source electrode SE may include various metal materials.

The drain electrode DE may be located on the buffer layer BUF and the active pattern ACT. The drain electrode DE may be spaced apart from the source electrode SE. That is, the drain electrode DE may not overlap the spacer SP.

The drain electrode DE may be connected to the third region A3 of the active pattern ACT. For example, the drain electrode DE may be directly connected to the third region A3 of the active pattern ACT. According to some embodiments, the drain electrode DE may partially overlap the third region A3 of the active pattern ACT.

The drain electrode DE may include the same material as the source electrode SE. That is, the drain electrode DE may include the same material as the source electrode SE and may be formed through the same process. For example, when the source electrode SE has a multilayer structure including Ti/Al/Ti, the drain electrode DE may also have a multilayer structure including Ti/Al/Ti. However, embodiments according to the present disclosure are not limited thereto, and the drain electrode DE may include various metal materials.

The first pad layer PL1 may be located on the source electrode SE, and the second pad layer PL2 may be located on the drain electrode DE. For example, the first pad layer PL1 may directly contact the source electrode SE, and the second pad layer PL2 may directly contact the drain electrode DE. The first pad layer PL1 may prevent damage to the source electrode SE, and the second pad layer PL2 may prevent damage to the drain electrode DE.

Each of the first and second pad layers PL1 and PL2 may include a metal, an alloy, a metal nitride, a conductive metal oxide, a transparent conductive material, and the like. For example, each of the first and second pad layers PL1 and PL2 may include indium tin oxide ("ITO"), indium zinc oxide ("IZO"), zinc tin oxide ("ZTO"), indium oxide ("InO$_x$"), indium tin zinc oxide ("ITZO"), zinc oxide ("ZnO$_x$"), tin oxide ("SnO$_x$"), and the like. These may be used alone or in combination with each other. As will be described later, the first and second pad layers PL1 and PL2 may be omitted.

The first insulating pattern IP1 may be located on the active pattern ACT. For example, the first insulating pattern IP1 may be located on the first region A1 of the active pattern ACT. According to some embodiments, the first insulating pattern IP1 may partially overlap each of the second and third regions A2 and A3 of the active pattern ACT. In addition, the first insulating pattern IP1 may be arranged to partially overlap each of the upper surface US and the first side surface SS1 of the spacer SP.

The first insulating pattern IP1 may include an inorganic insulating material. For example, the first insulating pattern IP1 may include an inorganic insulating material such as silicon oxide, silicon nitride, silicon oxynitride, and the like. These may be used alone or in combination with each other.

The second insulating pattern IP2 may be located on the first pad layer PL1. The second insulating pattern IP2 may partially overlap each of the source electrode SE and the first pad layer PL1. The second insulating pattern IP2 may include the same material as the first insulating pattern IP1 and may be formed through the same process. That is, the second insulating pattern IP2 may also include an inorganic insulating material such as silicon oxide, silicon nitride, silicon oxynitride, and the like. These may be used alone or in combination with each other.

The first gate electrode GE1 may be located on the first insulating pattern IP1. The first gate electrode GE1 may receive a gate signal. The first gate electrode GE1 may completely overlap the first region A1 of the active pattern ACT. In addition, the first gate electrode GE1 may be arranged to partially overlap each of the upper surface US of the spacer SP and the first side surface SS1 of the spacer SP. That is, a first end of the first gate electrode GE1 may overlap the upper surface US of the spacer SP, and a second end of the first gate electrode GE1 may overlap the upper surface US of the spacer SP.

For example, the first gate electrode GE1 may include a metal, an alloy, a metal nitride, a conductive metal oxide, a transparent conductive material, and the like. These may be used alone or in combination with each other.

Accordingly, the transistor TFT including the active pattern ACT, the first gate electrode GE1, the source electrode SE, the first pad layer PL1, the drain electrode DE, and the second pad layer PL2 may be located on the substrate SUB.

As described above, the active pattern ACT does not extend in a direction parallel to the upper surface of the substrate SUB (e.g., the first direction D1), and a portion of the active pattern ACT may extend in a direction parallel to the first side surface SS1 of the spacer SP. The transistor TFT including the active pattern ACT may be defined as a vertical transistor.

The second gate electrode GE2 may be located on the second insulating pattern IP2. The second gate electrode GE2 may overlap the second insulating pattern IP2. For example, the second gate electrode GE2 may partially overlap the second insulating pattern IP2. The second gate electrode GE2 may include the same material as the first gate electrode GE1. That is, the second gate electrode GE2 may include the same material as the first gate electrode GE1 and may be formed through the same process.

According to some embodiments, the second gate electrode GE2 and a portion of the source electrode SE overlapping the second gate electrode GE2 may constitute the storage capacitor CST.

The first insulating layer IL1 may be located on the buffer layer BUF, the active pattern ACT, the first and second insulating patterns IP1 and IP2, the first and second gate electrodes GE1 and GE2, the source electrode SE, the drain electrode DE, and the first and second pad layers PL1 and PL2. The first insulating layer IL1 may cover the active pattern ACT, the first and second insulating patterns IP1 and IP2, the first and second gate electrodes GE1 and GE2, the source electrode SE, the drain electrode DE, and the first and second pad layers PL1 and PL2. The first insulating layer IL1 may protect the active pattern ACT, the first and second insulating patterns IP1 and IP2, the first and second gate electrodes GE1 and GE2, the source electrode SE, the drain electrode DE, and the first and second pad layers PL1 and PL2 located thereon.

For example, the first insulating layer IL1 may sufficiently cover the active pattern ACT, the first and second insulating patterns IP1 and IP2, the first and second gate electrodes GE1 and GE2, the source electrode SE, the drain electrode DE, and the first and second pad layers PL1 and PL2, and may have a substantially flat upper surface without creating a step around the active pattern ACT, the first and second insulating patterns IP1 and IP2, the first and second gate electrodes GE1 and GE2, the source electrode SE, the drain electrode DE, and the first and second pad layers PL1 and PL2. Alternatively, the first insulating layer IL1 may cover the active pattern ACT, the first and second insulating patterns IP1 and IP2, the first and second gate electrodes GE1 and GE2, the source electrode SE, the drain electrode DE, and the first and second pad layers PL1 and PL2, and may be arranged along the profile of the active pattern ACT, the first and second insulating patterns IP1 and IP2, the first and second gate electrodes GE1 and GE2, the source electrode SE, the drain electrode DE, and the first and second pad layers PL1 and PL2 with a uniform thickness.

The first insulating layer IL1 may include an inorganic insulating material. For example, the first insulating layer IL1 may include an inorganic insulating material such as silicon oxide ("SiO$_x$"), silicon nitride ("SiN$_x$"), silicon carbide ("SiC$_x$"), silicon oxynitride ("SiO$_x$N$_y$"), silicon oxycarbide ("SiO$_x$C$_y$"), and the like. These may be used alone or in combination with each other. However, embodiments according to the present disclosure are not limited thereto, and the first insulating layer IL1 may include various insulating materials.

The second insulating layer IL2 may be located on the first insulating layer IL1. The second insulating layer IL2 may have a substantially flat upper surface. The second insulating layer IL2 may include an inorganic insulating material or an organic insulating material. According to some embodiments, the second insulating layer IL2 may include an organic insulating material. For example, the second insulating layer IL2 may an organic insulating material such as phenolic resin, polyacrylates resin, polyimides rein, polyamides resin, siloxane resin, epoxy resin, and the like. These may be used alone or in combination with each other. However, embodiments according to the present disclosure are not limited thereto, and the second insulating layer IL2 may include various insulating materials.

The lower electrode LE may be located on the second insulating layer IL2. The lower electrode LE may receive signals and voltages for driving the light emitting element LED from the transistor TFT. The lower electrode LE may be directly connected to the first pad layer PL1 through a contact hole penetrating the first and second insulating layers IL1 and IL2.

For example, the lower electrode LE may include a metal, an alloy, a metal nitride, a conductive metal oxide, a transparent conductive material, and the like. These may be used alone or in combination with each other. For example, the lower electrode LE may be an anode electrode. Alternatively, the lower electrode LE may be a cathode electrode.

The pixel defining layer PDL may be located on the second insulating layer IL2 and the lower electrode LE. The pixel defining layer PDL may have an opening exposing at least a portion of an upper surface of the lower electrode LE. In addition, the pixel defining layer PDL may cover both side portions of the lower electrode LE. Because the pixel defining layer PDL has the opening, the pixel defining layer PDL may define each sub-pixel (e.g., the first sub-pixel SPX1, the second sub-pixel SPX2, or the third sub-pixel SPX3 of FIG. 1) that emits light.

The pixel defining layer PDL may include an inorganic insulating material or an organic insulating material. According to some embodiments, the pixel defining layer PDL may include an organic insulating material. For example, the pixel defining layer PDL may include an organic insulating material such as photoresist, polyacrylic resin, polyimide resin, polyamide resin, siloxane resin, acrylic resin, epoxy resin, and the like. These may be used alone or in combination with each other. However, the present disclosure is not limited thereto, and the pixel defining layer PDL may include various insulating materials. Alternatively, the pixel defining layer PDL may include an organic insulating material containing a black pigment or black dye.

The light emitting layer EML may be located on the lower electrode LE. For example, the light emitting layer EML may be located within the opening of the pixel defining layer PDL. The light emitting layer EML may include materials for emitting light. For example, the light emitting layer EML may include an organic light emitting material or an inorganic light emitting material.

The upper electrode UE may be located on the pixel defining layer PDL and the light emitting layer EML. For example, the upper electrode UE may include a metal, an alloy, a metal nitride, a conductive metal oxide, a transparent conductive material, and the like. These may be used alone or in combination with each other. For example, the upper electrode UE may be a cathode electrode. Alternatively, the upper electrode UE may be an anode electrode.

Accordingly, the light emitting element LED including the lower electrode LE, the light emitting layer EML, and the upper electrode UE may be located on the substrate SUB.

The encapsulation layer ENL may be located on the upper electrode UE. The encapsulation layer ENL may prevent or reduce instances of impurities, moisture, contaminants, and the like permeating the light emitting element EL from the outside. The encapsulation layer ENL may include at least one inorganic encapsulation layer and at least one organic encapsulation layer. For example, the inorganic encapsulation layer may include silicon oxide, silicon nitride, silicon oxynitride, and the like, and the organic encapsulation layer may include a polymer cured material such as polyacrylate.

The display device DD according to embodiments of the present invention may include an organic light emitting display device ("OLED"), a liquid crystal display device ("LCD"), a field emission display device ("FED"), a plasma display device ("PDP"), an electrophoretic display device ("EPD"), a quantum dot display device, or an inorganic light emitting display device.

In order to realize a high resolution of the display device DD, the area occupied by the transistor TR needs to be reduced.

According to a comparative example, in a horizontal transistor in which an active pattern including a metal oxide semiconductor extends in a horizontal direction, the length of a channel region of the active pattern may be reduced to reduce an area occupied by the transistor. However, in this case, operation of the transistor may be difficult due to a short channel length effect.

In the display device DD according to some embodiments of the present disclosure, the active pattern ACT of the transistor TFT located on the substrate SUB may be arranged to extend along the first side surface SS1 of the spacer SP due to the spacer SP located on the substrate SUB. Here, the active pattern ACT may include a metal oxide semiconductor. That is, the transistor TFT may have a vertical transistor structure. Accordingly, because the length of first region A1 (i.e., the channel region) of the active pattern is determined vertically, a sufficient length of the channel region may be secured.

FIGS. 4, 5, 6, 7, 8, 9, 10, 11, 12, 13, 14, 15, and 16 are cross-sectional views for explaining a method of manufacturing the display device of FIG. 3.

Referring to FIG. 4, the buffer layer BUF may be formed on the substrate SUB. For example, the buffer layer BUF may be formed using an inorganic insulating material. A spacer SP may be formed on the buffer layer BUF. For example, the spacer SP may be formed using an inorganic insulating material.

Figure 5:

Referring to FIG. 5, a preliminary active pattern ACT' may be formed on the buffer layer BUF and the spacer SP. For example, the preliminary active pattern ACT' may be formed on the upper surface of the buffer layer BUF (or the upper surface of the substrate SUB), the upper surface of the spacer SP, and the first side surface SS1 of the spacer SP. For example, the preliminary active pattern ACT' may be formed using a metal oxide semiconductor. According to some embodiments, the preliminary active pattern ACT' may be formed using a metal oxide semiconductor having chemical resistance to an etchant used in a process of forming a source electrode (e.g., the source electrode of FIG. 8) and a drain electrode (e.g., the drain electrode of FIG. 8).

Figure 6:

Referring to FIG. 6, a first conductive layer CL1 and a second conductive layer CL2 may be sequentially formed on the buffer layer BUF and the preliminary active pattern ACT'. For example, the first conductive layer CL1 and the second conductive layer CL2 may be entirely formed on the buffer layer BUF and the preliminary active pattern ACT'. For example, the first conductive layer CL1 may be formed using aluminum, titanium, and the like, and the second conductive layer CL2 may be formed using indium zinc oxide, indium tin oxide, and the like.

Referring to FIGS. 7 and 8, a first photosensitive organic film may be formed on the second conductive layer CL2. For example, the first photosensitive organic film may be formed using a photoresist. Next, the first photosensitive organic film may be patterned through a photo process to form first and second photosensitive organic patterns PR1 and PR2. The first photosensitive organic pattern PR1 may overlap a region where the source electrode SE and the first pad layer PL1 are formed, and the second photosensitive organic pattern PR2 may overlap a region where the drain electrode DE and the second pad layer PL2 are formed.

Portions of the first and second conductive layers CL1 and CL2 may be removed using the first and second photosensitive organic patterns PR1 and PR2 as masks through a first etching process. For example, portions of the first conductive layer CL1 and the second conductive layer CL2 that do not overlap with the first and second photosensitive organic patterns PR1 and PR2 may be removed through the first etching process. Accordingly, the source electrode SE and the first pad layer PL1 may be formed in the region overlapping the first photosensitive organic pattern PR1, and the drain electrode DE and the second pad layer PL2 may be formed in the region overlapping the second photosensitive organic pattern PR2. That is, the source electrode SE, the first pad layer PL1, the drain electrode DE, and the second pad layer PL2 may be formed at the same time.

After the source electrode SE, the first pad layer PL1, the drain electrode DE, and the second pad layer PL2 are formed, the first and second photosensitive organic patterns PR1 and PR2 may be removed.

The source electrode SE and the first pad layer PL1 may be formed on the upper surface of the buffer layer BUF, the second side surface SS2 of the spacer SP, and connected to one end of the preliminary active pattern ACT'. In addition, the drain electrode DE and the second pad layer PL2 may be formed on the substrate SUB and connected to the other end of the preliminary active pattern ACT'.

Figure 9:

Referring to FIG. 9, the insulating layer IL may be entirely formed on the buffer layer BUF, the source electrode SE, the first pad layer PL1, the active pattern ACT, the drain electrode DE, and the second pad layer PL2. For example, the insulating layer IL may be formed using an inorganic insulating material. Then, a preliminary gate electrode GE' may be entirely formed on the insulating layer IL. For example, the preliminary gate electrode GE' may be formed using a metal and the like.

Referring to FIGS. 10 and 11, a second photosensitive organic film may be entirely formed on the preliminary gate electrode GE'. For example, the second photosensitive organic film may be formed using a photoresist. Then, third and fourth photosensitive organic patterns PR3 and PR4 may be formed by patterning the second photosensitive organic film through a photo process. The third photosensitive organic pattern PR3 may overlap a region where the second gate electrode GE2 is formed, and the fourth photosensitive organic pattern PR4 may overlap a region where the first gate electrode GE1 is formed.

A portion of the preliminary gate electrode GE' may be removed using the third and fourth photosensitive organic patterns PR3 and PR4 as a mask through a second etching process. For example, the portion of the preliminary gate electrode GE' that does not overlap with the third and third photosensitive organic patterns PR3 and PR4 may be removed through the second etching process. Accordingly, the second gate electrode GE2 may be formed in the region overlapping the third photosensitive organic pattern PR3, and the first gate electrode GE2 may be formed in the region overlapping the fourth photosensitive organic pattern PR4. After the first gate electrode GE1 and the second gate electrode GE2 are formed, the third and fourth photosensitive organic patterns PR3 and PR4 may be removed.

The first gate electrode GE1 may be formed to partially overlap each of the upper surface US of the spacer SP and the first side surface SS1 of the spacer SP. In addition, the second gate electrode GE2 may be formed to partially overlap each of the source electrode SE and the first pad layer PL1.

Referring to FIG. 12, a portion of the insulating layer IL may be removed using the first and second gate electrodes GE1 and GE2 as a mask through a third etching process. In detail, a portion of the insulating layer IL1 that does not overlap the first and second gate electrodes GE1 and GE2 may be removed through the third etching process. Accordingly, the first insulating pattern IP1 overlapping the first gate electrode GE1 may be formed, and the second insulating pattern IP2 overlapping the second gate electrode GE2 may be formed.

The first insulating pattern IP1 may be formed to partially overlap each of the upper surface US of the spacer SP and the first side surface SS1 of the spacer SP. The second insulating pattern IP2 may be formed between the first pad layer PL1 and the second gate electrode GE2.

In the process of partially removing the insulating layer IL through the third etching process, hydrogen included in the insulating layer IL may flow into the preliminary active pattern ACT'. The portion of the preliminary active pattern ACT' into which hydrogen flows from the insulating layer IL may have conductivity due to an increase in carrier concentration by the introduced hydrogen, and thus the portion of the preliminary active pattern ACT' may be as the second region A2 defined as the source region and the third region A3 defined as the drain region. Accordingly, the active pattern ACT having the second region A2, the third region A3, and the first region A1 positioned between the second region A2 and the third region A3 is formed.

In this case, the second region A2 of the active pattern ACT may be connected to the source electrode SE, and the third region A3 of the active pattern ACT may be connected to the drain electrode DE.

Figure 13:
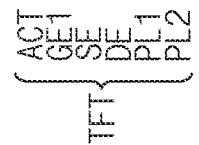

Referring to FIG. 13, the first insulating layer IL1 may be formed on the buffer layer BUF, the active pattern ACT, the first and second insulating patterns IL1 and IL2, the first and second gate electrodes GE1 and GE2, the source electrode SE, the drain electrode DE, and the first and second pad layers PL1 and PL2. The first insulating layer IL1 may sufficiently cover the active pattern ACT, the first and second insulating patterns IL1 and IL2, the first and second gate electrodes GE1 and GE2, the source electrode SE, the drain electrode DE, and the first and second pad layers PL1 and PL2. For example, the first insulating layer IL1 may be formed using an inorganic insulating material.

The second insulating layer IL2 may be formed on the first insulating layer IL1. For example, the second insulating layer IL2 may be formed using an organic insulating material.

Referring to FIGS. 14 and 15, a contact hole CNT exposing a portion of the upper surface of the first pad layer PL1 may be formed by removing portions of the first and second insulating layers IL1 and IL2. Then, the lower electrode LE filling the contact hole CNT may be formed on the second insulating layer IL2. That is, the lower electrode LE may be directly connected to the first pad layer PL1 through the contact hole CNT. For example, the lower electrode LE may be formed using a metal, a conductive metal oxide, a transparent conductive material, and the like.

Referring to FIG. 16, the pixel defining layer PDL may be formed on the second insulating layer IL2 and the lower electrode LE. An opening exposing at least a portion of an upper surface of the lower electrode LE may be formed in the pixel defining layer PDL. In addition, the pixel defining layer PDL may cover both side portions of the lower electrode LE. For example, the pixel defining layer PDL may be formed using an organic insulating material.

The light emitting layer EML may be formed on the lower electrode LE. The light emitting layer EML may include materials for emitting light. For example, the light emitting layer EML may be formed using an organic light emitting material or an inorganic light emitting material.

The upper electrode UE may be formed on the pixel defining layer PDL and the light emitting layer EML. For example, the upper electrode UE may be formed using a metal, a conductive metal oxide, a transparent conductive material, and the like.

Referring back to FIG. 3, the encapsulation layer ENL may be formed on the upper electrode UE. The encapsulation layer ENL may prevent or reduce instances of impurities, moisture, contaminants, and the like from permeating the light emitting element EL from the outside. The encapsulation layer ENL may include at least one inorganic encapsulation layer and at least one organic encapsulation layer.

Accordingly, the display device DD illustrated in FIG. 3 may be manufactured.

In the method of manufacturing the display device according to some embodiments of the present disclosure, the spacer SP may be formed on the substrate SUB, an active pattern (e.g., the preliminary active pattern ACT') may be formed to extend along upper surface US and the first side surface SS1 of the spacer SP, and the source electrode SE connected to one end of the active pattern and the drain electrode DE connected to the other end of the active pattern may be simultaneously formed. That is, because the source electrode SE and the drain electrode DE constituting the vertical transistor are formed through the same process, the number of masks in the entire process may be reduced. Accordingly, the process cost of the display device DD may be reduced.

Figure 17:
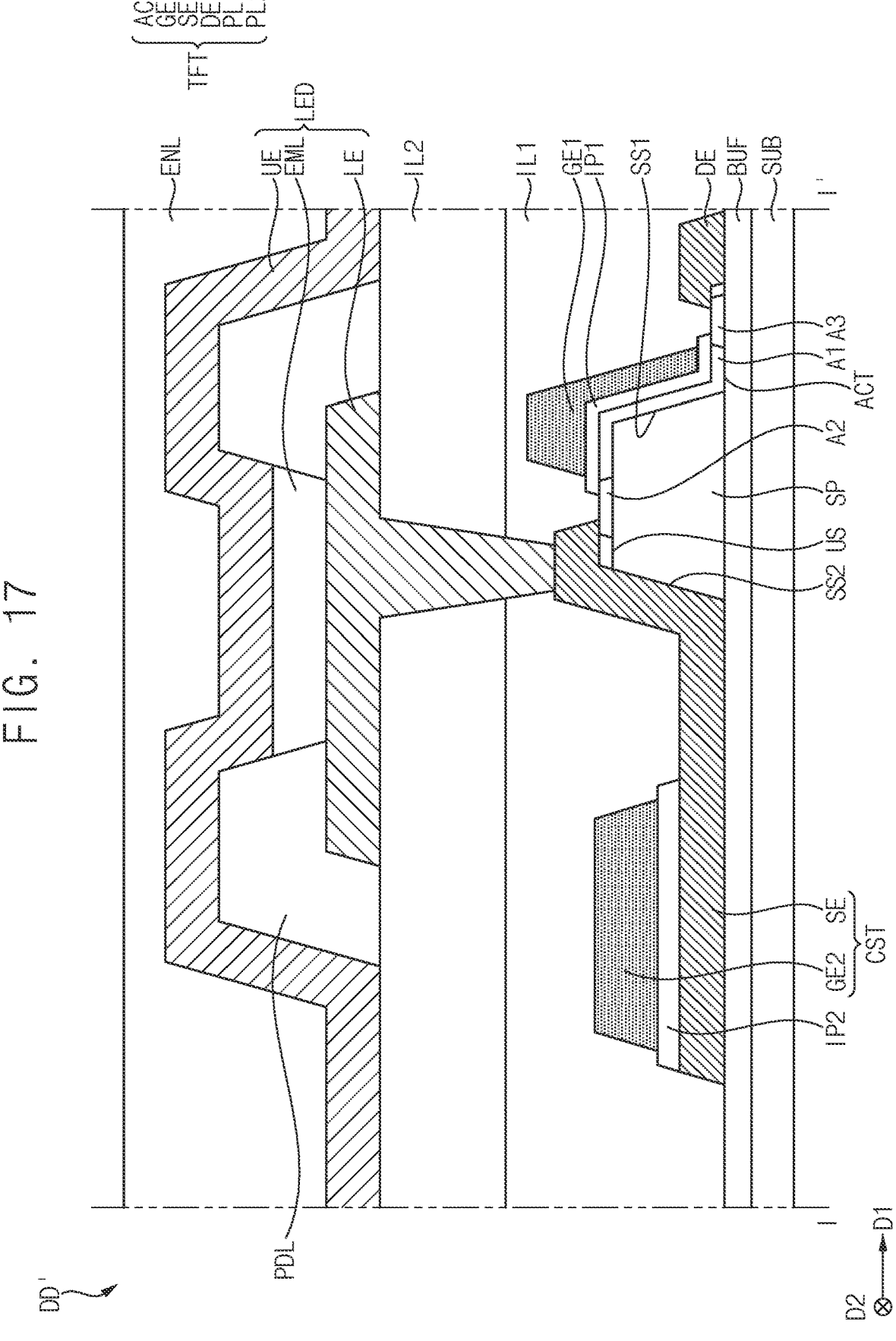
FIG. 17 is a cross-sectional view illustrating a display device according to some embodiments of the present disclosure.

FIG. 17 is a cross-sectional view illustrating a display device according to some embodiments of the present disclosure.

Referring to FIG. 17, the display device DD' according to some embodiments may include the substrate SUB, the buffer layer BUF, the spacer SP, the transistor TFT, the first insulating pattern IP1, the second insulating pattern IP2, the second gate electrode GE2, the first insulating layer IL1, the second insulating layer IL2, the pixel defining layer PDL, the light emitting element LED, and the encapsulation layer ENL. Hereinafter, descriptions overlapping those of the display device DD described with reference to FIG. 3 will be omitted or simplified.

The source electrode SE may be located on the buffer layer BUF and the active pattern ACT. In addition, the drain electrode DE may be located on the buffer layer BUF to be spaced apart from the source electrode SE. According to some embodiments, a first pad layer (e.g., the first pad layer PL1 of FIG. 3) may be not located on the source electrode SE, and a second pad layer (e.g., the first pad layer PL1 in FIG. 3) may be located on the drain electrode DE.

The lower electrode LE located on the second insulating layer IL2 may be located. According to some embodiments, the lower electrode LE may be directly connected to the source electrode SE through a contact hole penetrating the first and second insulating layers IL1 and IL2.

Figure 18:
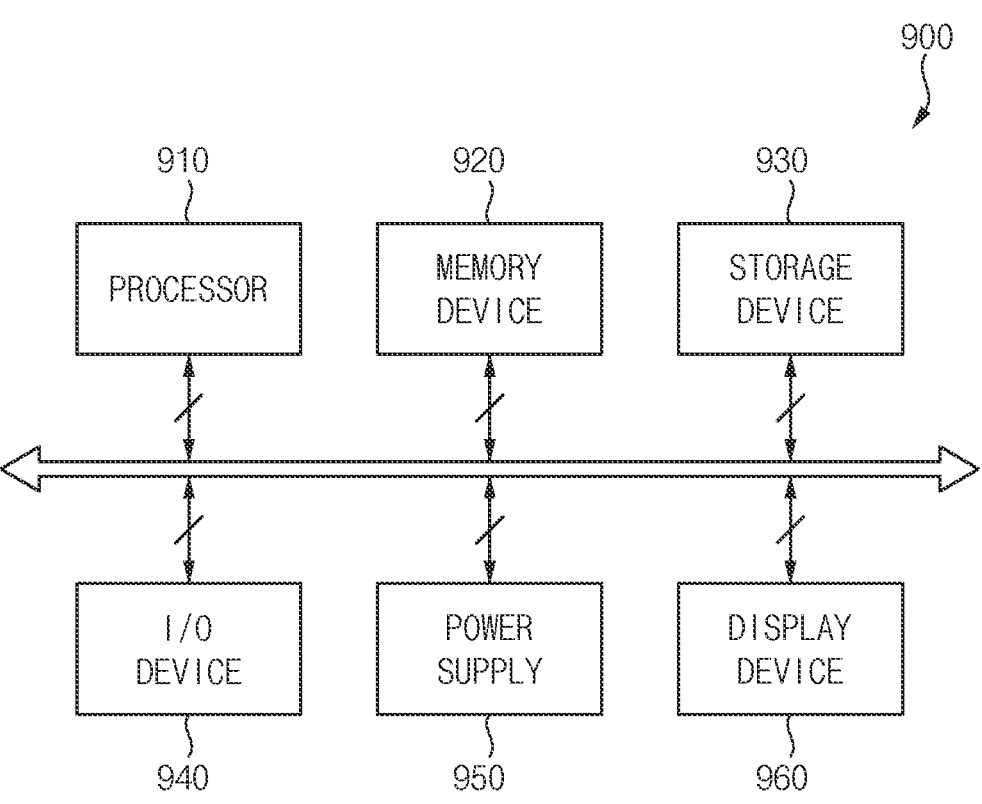
FIG. 18 is a block view illustrating an electronic device including the display device of FIG. 1 according to some embodiments of the present disclosure.
Figure 19:
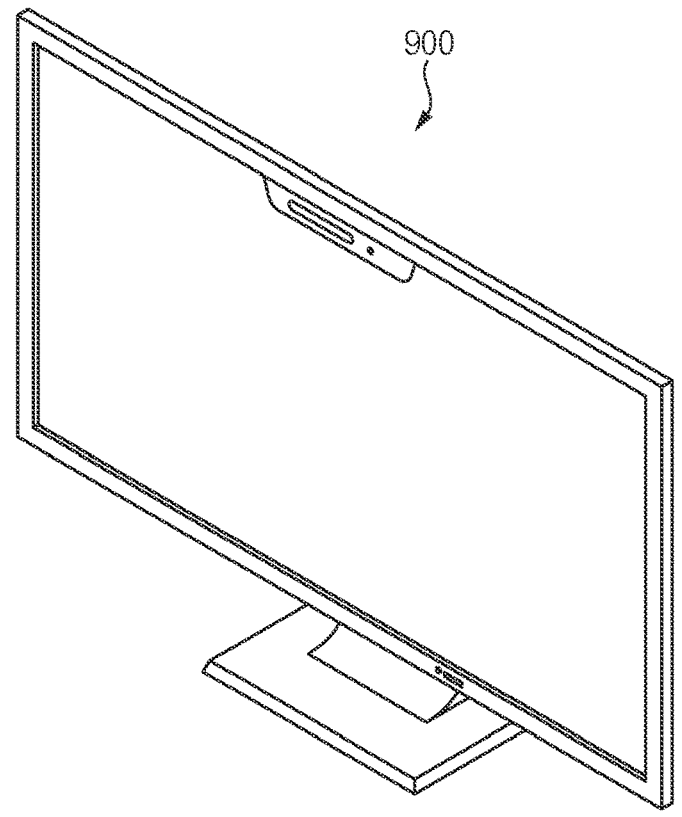
FIG. 19 is a view illustrating an example in which the electronic device of FIG. 18 is implemented as a television according to some embodiments of the present disclosure.
Figure 20:
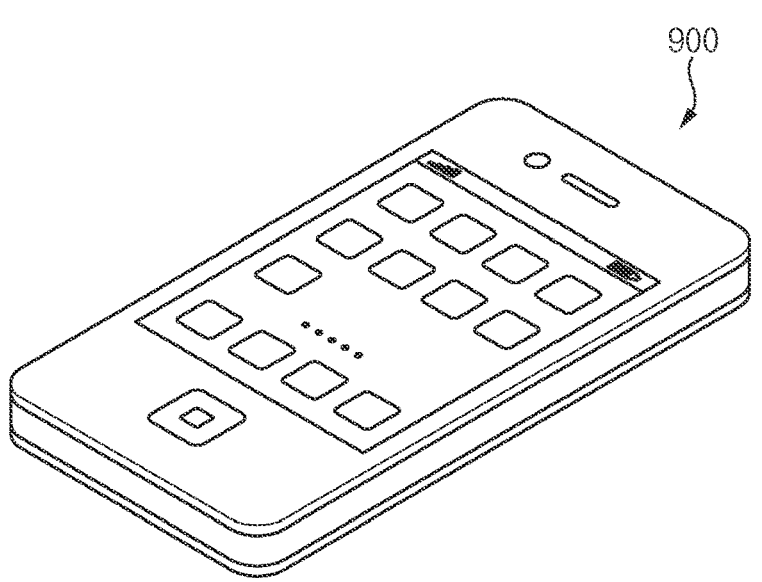
FIG. 20 is a view illustrating an example in which the electronic device of FIG. 18 is implemented as a smart phone according to some embodiments of the present disclosure.

FIG. 18 is a block view illustrating an electronic device including the display device of FIG. 1. FIG. 19 is a view illustrating an example in which the electronic device of FIG. 18 is implemented as a television. FIG. 20 is a view illustrating an example in which the electronic device of FIG. 18 is implemented as a smart phone.

Referring to FIGS. 18, 19, and 20, according to some embodiments, an electronic device 900 may include a processor 910, a memory device 920, a storage device 930, an I/O device 940, a power supply 950, and a display device 960. In this case, the display device 960 may correspond to the display device DD described with reference to FIGS. 1, 2, and 3. The electronic device 900 may further include several ports capable of communicating with a video card, a sound card, a memory card, a USB device, and the like.

According to some embodiments, as shown in FIG. 19, the electronic device 900 may be implemented as a television. According to some embodiments, as shown in FIG. 20, the electronic device 900 may be implemented as a smart phone. However, the electronic device 900 is not limited thereto, and for example, the electronic device 900 may be implemented a mobile phone, a video phone, a smart pad, a smart watch, a tablet PC, a vehicle navigation device, computer monitor, laptop computer, head mounted display ("HMD"), or the like.

The processor 910 may perform certain calculations or tasks. According to some embodiments, the processor 910 may be a microprocessor, a central processing unit ("CPU"), an application processor ("AP"), or the like. The processor 910 may be connected to other components through an address bus, a control bus, a data bus, and the like. The processor 910 may also be connected to an expansion bus such as a peripheral component interconnect ("PCI") bus, and the like.

The memory device 920 may store data necessary for the operation of the electronic device 900. For example, the memory device 920 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or a volatile memory device such as a dynamic random access memory ("DRAM") device, a static random access memory ("SRAM") device, a mobile DRAM device, or the like.

The storage device 930 may include a solid state drive ("SSD"), a hard disk drive ("HDD"), a CD-ROM, and the like.

The I/O device 940 may include input means such as a keyboard, keypad, touch pad, touch screen, mouse, and the like and output means such as a speaker and a printer, and the like.

The power supply 950 may supply power necessary for the operation of the electronic device 900. The display device 960 may be connected to other components through buses or other communication links. According to some embodiments, the display device 960 may be included in the I/O device 940.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:
a substrate;
a spacer on the substrate and comprising:
an upper surface;
a first side surface extending toward the substrate from a first end of the upper surface; and
a second side surface extending toward the substrate from a second end of the upper surface;
an active pattern on the first side surface of the spacer, including a metal oxide semiconductor, and having a source region and a drain region;
a source electrode on the second side surface of the spacer and the active pattern, and connected to the source region;
a drain electrode on the substrate, including a same material as the source electrode, and connected to the drain region; and
a first gate electrode on the active pattern such that the active pattern is between the first gate electrode and the spacer, with the first gate electrode partially overlapping the first side surface of the spacer.

2. The display device of claim 1, wherein the metal oxide semiconductor of the active pattern includes a material having chemical resistance.

3. The display device of claim 1, wherein a first end of the active pattern overlaps the upper surface of the spacer and a second end of the active pattern does not overlap the upper surface of the spacer.

4. The display device of claim 1, wherein the source region overlaps the upper surface of the spacer and the drain region does not overlap the upper surface of the spacer.

5. The display device of claim 1, wherein the source electrode extends along the second side surface of the spacer to an upper surface of the substrate.

6. The display device of claim 1, wherein the source electrode partially overlaps the source region and the drain electrode partially overlaps the drain region.

7. The display device of claim 1, wherein the active pattern further includes:
a channel region between the source region and the drain region, and partially overlapping each of the upper surface and the first side surface of the spacer, and
the first gate electrode completely overlaps the channel region.

8. The display device of claim 1, wherein a first end of the first gate electrode overlaps the upper surface of the spacer and a second end of the first gate electrode does not overlap the upper surface of the spacer.

9. The display device of claim 1, further comprising:
a first insulating pattern between the active pattern and the first gate electrode,
wherein the first insulating pattern partially overlaps each of the source region and the drain region.

10. The display device of claim 1, wherein the spacer includes an insulating material.

11. The display device of claim 1, wherein each of the first side surface and second side surface of the spacer is inclined with respect to the substrate.

12. The display device of claim 1, further comprising:
a second gate electrode on the source electrode and including a same material as the first gate electrode,
wherein the second gate electrode constitutes a storage capacitor together with a portion of the source electrode overlapping the second gate electrode.

13. The display device of claim 12, further comprising:
a second insulating pattern between the source electrode and the second gate electrode.

14. The display device of claim 1, further comprising:
a first pad layer on the source electrode; and
a second pad layer on the drain electrode and including a same material as the first pad layer.

15. The display device of claim 14, further comprising:
a lower electrode on the source electrode;
a light emitting layer on the lower electrode; and
an upper electrode on the light emitting layer,
wherein the lower electrode is directly connected to the first pad layer through a contact hole.

16. A method of manufacturing a display device, the method comprising:
forming a spacer on a substrate comprising:
an upper surface;
a first side surface extending toward the substrate from a first end of the upper surface; and
a second side surface extending toward the substrate from a second end of the upper surface on the substrate;
forming a preliminary active pattern including a metal oxide semiconductor on the first side surface of the spacer;
simultaneously forming a source electrode connected to a first end of the preliminary active pattern on the second side surface of the spacer and the preliminary active pattern, and a drain electrode connected to a second end of the preliminary active pattern on the substrate; and
forming a first gate electrode partially overlapping the first side surface of the spacer on the preliminary active pattern such that the preliminary active pattern is between the first gate electrode and the spacer.

17. The method of claim 16, further comprising:
forming an insulating pattern between the preliminary active pattern and the first gate electrode after the forming the first gate electrode.

18. The method of claim 17, wherein the forming the insulating pattern includes:
forming an active pattern having a source region, a drain region, and a channel region between the source region and the drain region by introducing hydrogen into the preliminary active pattern.

19. The method of claim 18, wherein the source electrode is connected to the source region to partially overlap the source region and the drain electrode is connected to the drain region to partially overlap the drain region.

20. An electronic device comprising:
a display device; and
a power supply which supplies power the display device,
wherein the display device includes:
a substrate;
a spacer on the substrate and comprising:
an upper surface;
a first side surface extending toward the substrate from a first end of the upper surface; and a second side surface extending toward the substrate from a second end of the upper surface;

an active pattern on the first side surface of the spacer, including a metal oxide semiconductor, and having a source region and a drain region;

a source electrode on the second side surface of the spacer and the active pattern, and connected to the source region;

a drain electrode on the substrate, including a same material as the source electrode, and connected to the drain region; and a first gate electrode on the active pattern such that the active pattern is between the first gate electrode and the spacer, with the first gate electrode partially overlapping the first side surface of the spacer.

* * * * *